(12) United States Patent
Wickersham, Jr. et al.

(10) Patent No.: US 7,467,741 B2
(45) Date of Patent: Dec. 23, 2008

(54) METHOD OF FORMING A SPUTTERING TARGET ASSEMBLY AND ASSEMBLY MADE THEREFROM

(75) Inventors: Charles E. Wickersham, Jr., Columbus, OH (US); David P. Workman, Dublin, OH (US)

(73) Assignee: Cabot Corporation, Boston, MA (US)

( * ) Notice: Subject to any disclaimer, the term of this patent is extended or adjusted under 35 U.S.C. 154(b) by 651 days.

(21) Appl. No.: 10/689,771

(22) Filed: Oct. 21, 2003

(65) Prior Publication Data
US 2004/0079634 A1 Apr. 29, 2004

Related U.S. Application Data

(60) Provisional application No. 60/419,916, filed on Oct. 21, 2002.

(51) Int. Cl.
*C23C 14/34* (2006.01)
*B23K 20/12* (2006.01)

(52) U.S. Cl. .................... 228/114; 228/112.1; 228/115; 228/116; 228/136; 228/164; 228/166; 228/167; 228/168; 228/171; 228/173.2; 228/165; 228/193; 228/194; 228/195; 204/298.12; 204/198.13

(58) Field of Classification Search ............ 204/298.12, 204/298.13; 228/112.1, 114, 115, 116, 136, 228/164, 165, 166, 167, 168, 171, 173.2, 228/193–195
See application file for complete search history.

(56) References Cited

U.S. PATENT DOCUMENTS

| | | | |
|---|---|---|---|
| 3,452,421 A | 7/1969 | Cheng et al. | 29/470.3 |
| 3,693,238 A | 9/1972 | Hoch et al. | 29/470.3 |
| 3,998,376 A | 12/1976 | Haines | 228/154 |
| 4,349,954 A | 9/1982 | Banks | 29/458 |
| 4,983,269 A * | 1/1991 | Wegmann | 204/192.13 |
| 5,230,459 A | 7/1993 | Mueller et al. | 228/164 |
| 5,269,899 A | 12/1993 | Fan | 204/298.09 |
| 5,286,361 A | 2/1994 | Makowiecki et al. | 204/298.12 |
| 5,342,496 A * | 8/1994 | Stellrecht | 204/298.12 |
| 5,522,535 A | 6/1996 | Ivanov et al. | 228/122.1 |
| 5,593,082 A | 1/1997 | Ivanov et al. | 228/122.1 |
| 5,653,856 A | 8/1997 | Ivanov et al. | 204/192.12 |
| 5,693,203 A * | 12/1997 | Ohhashi et al. | 204/298.12 |
| 5,836,506 A * | 11/1998 | Hunt et al. | 228/172 |
| 6,183,883 B1 | 2/2001 | Mori et al. | 428/621 |
| 6,199,259 B1 | 3/2001 | Demaray et al. | 29/458 |
| 6,725,522 B1 | 4/2004 | Ivanov et al. | 29/525 |

(Continued)

FOREIGN PATENT DOCUMENTS

JP 61-291967 * 12/1986

(Continued)

OTHER PUBLICATIONS

International Search Report for PCT/US03/33249.

*Primary Examiner*—Rodney G McDonald

(57) ABSTRACT

A method of forming a sputtering target assembly and the sputtering target assembly made therefrom are described. The method includes bonding a sputtering target to a backing plate at a low temperature. Also described is a method of forming a sputtering target assembly such that a gap is formed between the sputtering target and the backing plate. Also described is a method of forming a sputtering target assembly providing a mechanism to prevent unintended sputtering into the backing plate.

42 Claims, 4 Drawing Sheets

U.S. PATENT DOCUMENTS

| | | | |
|---|---|---|---|
| 6,749,103 B1 | 6/2004 | Ivanov et al. | 228/115 |
| 2004/0035698 A1 | 2/2004 | Ivanov et al. | 204/298.12 |

FOREIGN PATENT DOCUMENTS

| | | | |
|---|---|---|---|
| JP | 01-052065 | * | 2/1989 |
| WO | WO 90/10947 | | 9/1990 |
| WO | WO 96/15283 | | 5/1996 |
| WO | WO 00/15863 | * | 3/2000 |
| WO | WO 02/47865 | * | 6/2002 |
| WO | WO 02/49785 | * | 6/2002 |

* cited by examiner

METHOD OF FORMING A SPUTTERING TARGET ASSEMBLY AND ASSEMBLY MADE THEREFROM This application claims the benefit under 35 U.S.C. § 119(e) of prior U.S. Provisional Patent Application No. 60/419,916 filed Oct. 21, 2002, which is incorporated in its entirety by reference herein.

BACKGROUND OF THE INVENTION

The present invention relates to sputtering targets and sputtering target assemblies as well as methods of making the same. The present invention also relates to a bonding method for making a sputtering target assembly, preferably at a low temperature.

In the sputter application field, typically a sputtering target assembly has a sputtering target and a backing plate. For instance, a metal target or metal target blank (e.g., tantalum, titanium, aluminum, copper, cobalt, tungsten, etc.) is bonded onto a backing plate, such as a backing plate flange assembly such as copper, aluminum, or alloys thereof. To achieve good thermal and electrical contact between the target and the backing plate, these members are commonly attached to each other by means of soldering, brazing, diffusion bonding, clamping, and by epoxy cement and the like. However, sputtering target assemblies bonded by methods at high temperatures can warp the assembly during use which affects performance of the sputtering target assembly, especially when a large difference exists between the coefficients of thermal expansion for the target and the backing plate. Moreover, the differential thermal expansion between the target material and the backing plate material which occurs when bonding is accomplished at elevated temperatures by soldering, brazing, or diffusion bonding, generates very high levels of mechanical stress in the metal bodies. The mechanical stress often causes deflection of the target assembly and can cause the bond to fail so that the target separates from the backing plate.

The bonding process also adds weight and creates the risk of having a target assembly debond while in use. The debonding risk is even more possible due to the continuing progression of the industry to use larger and larger targets.

Additionally, the high temperatures associated with some conventional bonding methods can result in undesirable grain growth in the target metal.

SUMMARY OF THE PRESENT INVENTION

A feature of the present invention is to provide a method of forming a sputtering target assembly which avoids the debonding issue by providing a fail-safe bond between the target and the backing plate.

Another feature of the present invention is to provide a method of forming a sputtering target assembly for controlling thermal resistance at the interface of the target and the backing plate.

A further feature of the present invention is to provide a method of forming a sputtering target assembly which prevents unintended sputtering of the backing plate.

Additional features and advantages of the present invention will be set forth in part in the description that follows, and in part will be apparent from the description, or may be learned by practice of the present invention. The objectives and other advantages of the present invention will be realized and attained by means of the elements and combinations particularly pointed out in the description and appended claims.

To achieve these and other advantages, and in accordance with the purposes of the present invention, as embodied and broadly described herein, the present invention relates to a method of forming a sputtering target assembly. The method provides for bonding a target and a backing plate that are typically made from metal.

The present invention further relates to a friction weld or mechanical joint with friction (orbital riveting) bonding method of making a sputtering target assembly which contains a backing plate and a sputtering target blank which are typically made from materials having dissimilar thermal expansion coefficients.

The present invention also relates to a method of forming a sputtering target assembly by aligning projections on an assembly member with the grooves on another assembly member that are adapted to receive the projections. The heat produced by friction between the surfaces of the projections and the grooves causes the projections to soften or deform and fill in the grooves. When the projections harden, a mechanical and sometimes a metallurgical interlock is formed between the target and the backing plate.

Also, the present invention relates to a method of forming a sputtering target assembly which forms a gap between the assembled target and backing plate which reduces heat transfer between the target and the backing plate and increases the equilibrium temperature of the target during the sputtering process. The size of the gap between the assembled target and backing plate can be controlled by varying the relationship between the volume of the projections and the volume of the grooves.

Also, the present invention relates to a method of forming a sputtering target assembly that includes a mechanism for preventing the target user from sputtering into the backing plate. The mechanism includes a gas cell, preferably located in areas of greatest sputter erosion, that bursts when the layer of target adjacent the cell is eroded to a predetermined thickness. When the cell bursts, a transient pressure occurs and pressure monitors in the sputtering enclosure signal to the user to stop the sputtering process.

It is to be understood that both the foregoing general description and the following detailed description are exemplary and explanatory only and are intended to provide a further explanation of the present invention, as claimed.

The accompanying drawings, which are incorporated in and constitute a part of this application, illustrate various aspects of the present invention and together with the description, serve to explain the principles of the present invention

DETAILED DESCRIPTION OF THE PRESENT INVENTION

Figure 1:
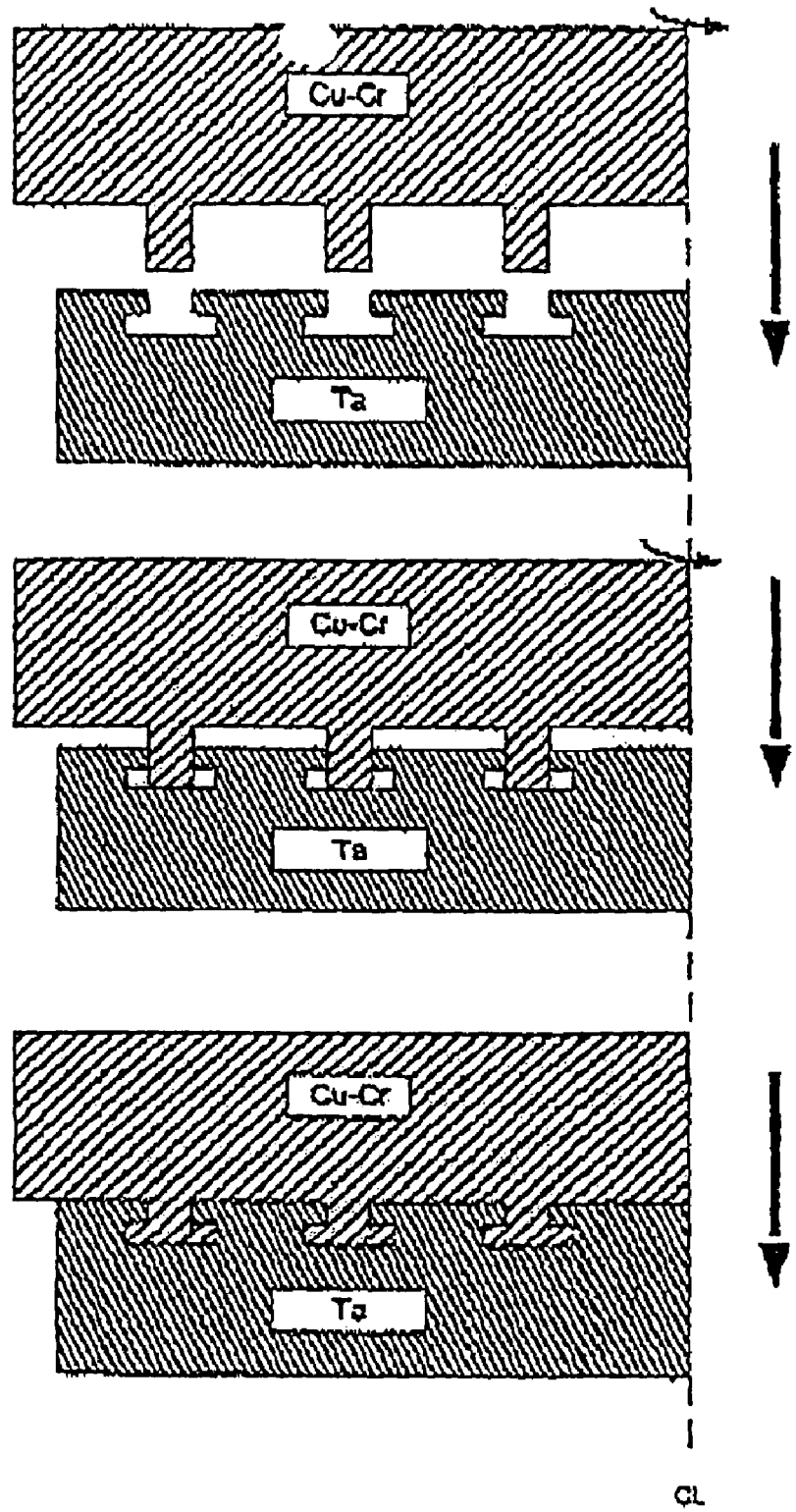
FIG. 1 is a cutaway view of a sputtering target assembly of the present invention.

The present invention is directed to a method of assembling a sputtering target assembly by a bonding process that includes fixing a target member to a backing member, preferably at a low temperature. The method includes positioning an assembly member having a bonding side with a plurality of projections, and an assembly member having a bonding side with a plurality of grooves adapted to receive the projections, such that the projections and said grooves are in substantial registration; slidably contacting a portion of at least one projection with a portion of at least one groove; and partially deforming said at least one projection(s) to at least partially fill the groove(s), thereby bonding the target member and the backing member when the projection(s) hardens.

Preferably, the sputtering target assembly, as described above, contains two assembly members, i.e., a backing plate member and a sputtering target member. The sputtering target member and the backing plate can be any suitable target grade and backing plate grade materials. With respect to the target materials to be bonded by the method of the present invention, examples include, but are not limited to, tantalum, niobium, cobalt, titanium, copper, aluminum, and alloys thereof, for instance, the alloys described above. Examples of the backing plate include, but are not limited to, copper, or a copper alloy, tantalum, niobium, cobalt, titanium, aluminum, and alloys thereof, such as TaW, NbW, TaZr, NbZr, TaNb, NbTa, TaTi, NbTi, TaMo, NbMo, and the like. No limitation exists as to the type of materials used in the sputtering target and the backing plate. The thicknesses of the backing and the target material can be any suitable thickness used for forming sputtering targets. Alternatively, the backing plate and the target material or other metal plate to be bonded onto the backing plate can be any suitable thickness for the desired application. Examples of suitable thicknesses of the backing plate and of the target material include, but are not limited to, a backing plate with a thickness of from about 0.25 or less to about 2 inches or more in thickness and targets with a thickness ranging from about 0.060 inches to about 1 inch or greater. In the present invention, the target material to be bonded onto the backing plate can be conventional target grade material for instance as described in U.S. Pat. No. 6,348,113, incorporated in its entirety by reference herein. The sputtering target can also have an interlayer as is conventional in the industry. Furthermore, the sputtering target can be a hollow cathode magnetron sputtering target and can be other forms of sputtering targets such as planar magnetron assemblies incorporating stationary or rotating permanent or electromagnets. The purity, texture, and/or grain size and other parameters, including size and the like are not critical to the present invention. The present invention provides a method of making a sputtering target assembly with any type of sputtering target and backing plate.

The target member used to practice the present invention includes two sides, a sputtering side and a bonding side which is opposed to the sputtering side. The backing member of the present invention includes two sides, a bonding side and a back side which is opposed to the bonding side. The sputtering target assembly of the present invention is formed or assembled by fixing the bonding side of the target member to the bonding side of the backing member. An interface is defined by an area between the bonding side of the target member and the bonding side of the backing member. The bonding sides can be fixed to each other such that a surface of the bonding side of the backing member and a surface of the bonding side of the target member are in substantial contact; the surfaces of the bonding sides are not in substantial contact; or, an interlayer can be interposed between a portion of the surfaces of the bonding sides. The interlayer can be a bonding media. The interlayer can also be in the form of a foil, plate, or block. Examples of interlayer materials can include, but are not limited to zirconium and the like and are conventional in the industry, titanium as found in U.S. Pat. No. 5,863,398 and U.S. Pat. No. 6,071,389; copper, aluminum, silver, nickel, and alloys thereof, as found in U.S. Pat. No. 5,693,203, and graphite as found in U.S. Pat. No. 6,183,613 B1, each of which is incorporated in its entirety by reference herein.

The target member and the backing member can be made from materials having dissimilar melting points. Grooves can be formed in the bonding side of the member (target or backing member) having a melting point that is greater than that of the material from which the other member is made. Preferably, the target member is made from a material having a higher melting point than that of the material from which the backing member is made. Grooves can be formed by any suitable method including machining. The grooves can be formed to have a lengthwise dimension so that an extended groove track, channel, or cavity is formed. Preferably, the groove cavity is annular so as to form a continuous recessed track. One or more cavities can be formed in the bonding side. Multiple groove cavities can be arranged concentrically.

Figure 2:
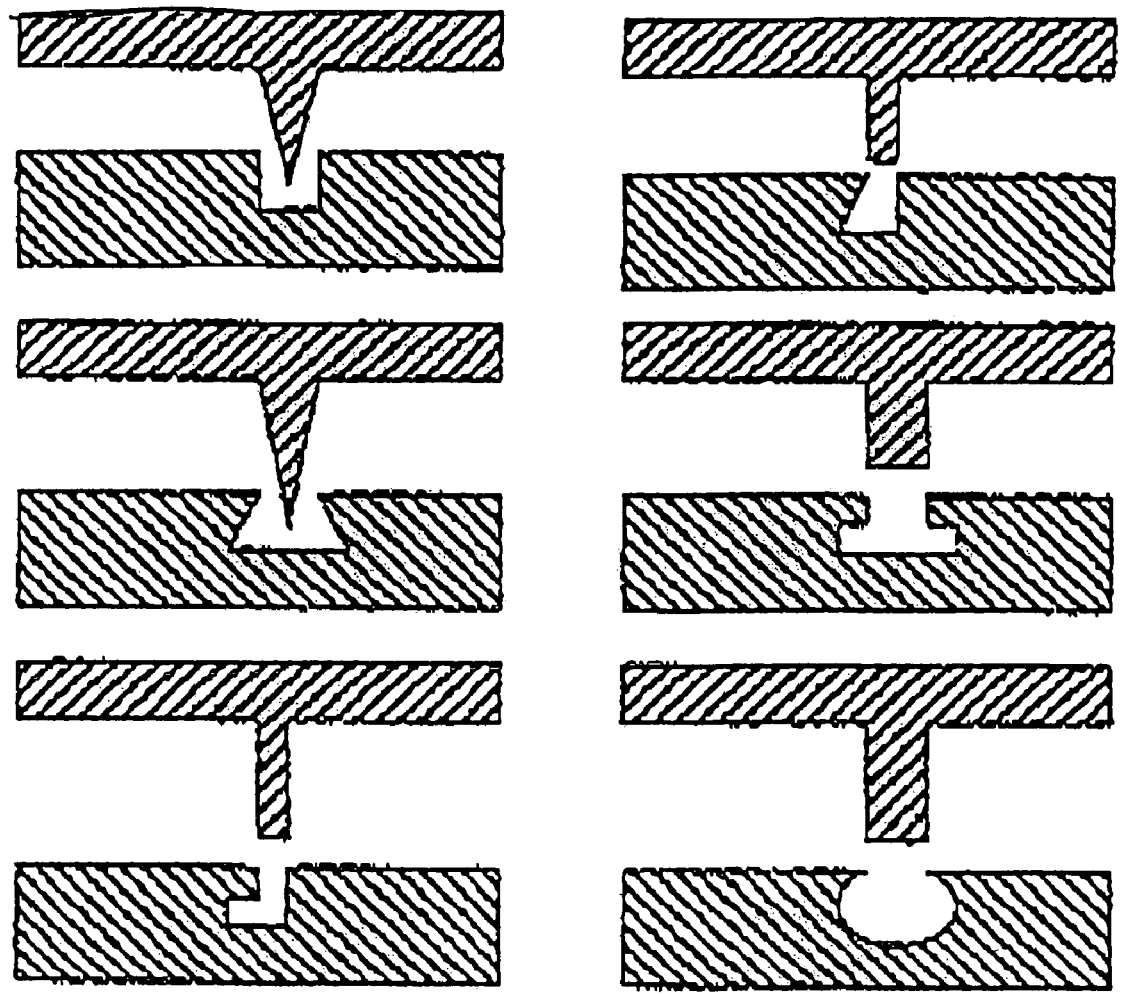
FIG. 2 is a cutaway view of various shapes and sizes of projections and grooves of the present invention. Other shapes and sizes are possible.

The opening of the groove cavity is adapted to receive the projections on the member having the projections. That is, the groove opening is of a sufficient dimension and shape to allow the projection to pass into the opening. Interior to the opening of the grooves, the diameter of the grooves can increase, decrease, or remain constant. The interior of the grooves can be of any shape and volume. FIG. 2 shows examples of variations on groove designs; others are possible. Groove shapes can be regular or irregular. A cross section of a groove can generally form a square, rectangle, "T", "L", semicircle, truncated triangle, cusp, bowtie, etc. An interlocking design results from a groove shape in which a projection and a groove engage by overlapping, and would generally include grooves in which an interior diameter of the groove is greater than the diameter of the groove opening as well as various other designs, such as an "L"-shaped design. Also, as to a member having more than one groove cavity, the shape of the groove cavities can be dissimilar. Also, any one groove cavity can vary in shape along the length of the groove cavity. The grooves can be any depth such as from about 0.01 inch or less to 0.5 inch or more and, preferably, from about 0.025 inch to 0.075 inch.

Projections can be formed in the bonding side of the member having a melting point that is lower than that of the material from which the other member is made. Preferably, the backing member is made from a material having a lower melting point than that of the material from which the target member is made. The projections can be formed by any suitable method including machining. The projection has a distal end and an opposing proximal end that is attached at the bonding side of the member. The distal end is of such a shape and a dimension to permit the projection to enter the opening of the corresponding groove in the groove-containing member and to come in contact with a surface of the interior of the groove. The projection can be of any size or shape. FIG. 2 shows variations on projection design; others are possible. A cross section of a projection can generally form a rectangle, triangle, or other suitable shape. The projection can be of any regular or irregular shape. The projection can be in the shape of a cylinder, cone, truncated cone, cube, cuboid, pyramid, obelisk, wedge, etc.

The projections are arranged on the bonding side of the member such that the projections can be mated with a corresponding groove on the bonding side of the other member. Notably, the groove-containing member may include a larger number of groove cavities than the number of projections on the projection-containing member. That is, every groove need not have a corresponding projection. The projections can be spaced apart as desired. For example, the projections can be spaced so close to one another in a row so as to approximate a continuous ridge. Multiple projections can be arranged in rows. Preferably, the projections are arranged circularly. Multiple rows of grooves can be used to mate with the grooves in the groove-containing member. Preferably, multiple rows of projections are arranged concentrically. The shape and dimension of any one projection in a row can be dissimilar to other projections in the same row. Likewise, concentric rows of projections can contain projections of dissimilar shape and dimension. The height of the projection measured from its proximal end to its distal end can be from 0.01 inch or less to 0.5 inch or more, and preferably from about 0.05 inch to about 0.2 inch. The projection can be any cross-section such as from about 0.0001 sq inch to 0.25 sq inch. Preferably, the projection is made from a copper-chromium or copper-zinc alloy.

Positioning the backing member and the target member involves aligning one adjacent to the other so that each projection has a corresponding groove into which it can be guided. Slidably contacting the projections with their corresponding grooves involves directing the projections into the grooves so that a surface of both are in contact. The initial contacting of a surface of a projection with a surface of a groove involves directing the distal end of a projection through the opening of a groove by moving the backing member toward the target member, moving the target member toward the backing member, or moving both the backing member and target member toward each other, and continuing to the point where contact is made between a surface of at least some projections and the surface of at least some grooves. An example of this is shown in FIG. 1.

Sliding contact is made when the projection and groove surfaces are made to move laterally relative to each other while maintaining contact between them. Relative motion between the projection and groove surfaces can be achieved by displacing the target member, the backing member, or both. The relative motion between the projection and groove surfaces can include various movements of the backing member and the target member. For example, a back-and-forth motion can be used wherein the direction of movement is reversed periodically, or preferably, the motion can be in a circular direction about the axis of the target and backing members. Preferably, the backing member is rotated about its axis while the target member is held stationary.

The rotational speed can be varied and can be reversed. The rotational speed can be any speed such as from about 1 to about 10,000 rpm or higher. For example, the rotational speed can be from about 500 rpm or less to about 2000 rpm or more and preferably from about 1000 to about 1500 rpm. The rotational speed can be, for instance, from about 500 ft/min or less to about 2000 ft/min or more, and preferably from about 900 to about 1000 ft/min. Other rotational speeds are possible. An inertial rotational speed sufficient to bond the members can be predetermined. The number of rotations can be predetermined. The duration of rotation can be predetermined. A time to decelerate from the inertial rotational speed to 0 rpm can be from about 1 to about 100 seconds, for example, from about 5 to about 10 seconds from a rotational speed of about 1250 rpm. Other deceleration times are possible. Bonding of the assembly members in the above-described manner can be achieved, for example, by a rotational energy of from about 60 ft-lb/in$^2$ or less to about 190 ft-lb/in$^2$ or more, for example, 100 to about 130 ft-lb/in$^2$. Other rotational energies are possible.

It will be appreciated that the projections can be configured to account for the variation of angular velocity in the area of any particular projection relative to the axis of rotation. Rotation can begin before initial contact is made between the surface of the projection and the surface of the groove, and even before the projection enters the opening of the groove.

While slidably contacting the surfaces of the projections and the grooves, a joining or forging force or pressure is applied axially in the general direction of the interface between the bonding side of the target member and bonding side of the backing member. Force can be applied via the target member, the backing member, or both. Preferably, force is applied to the backing member in the direction of the target member. The joining force so applied can be constant or be varied. The joining force can be any force such as from about 10 pounds to about 100,000 pounds, or any amount to provide sufficient force to permit deforming of the projection into the groove. For example, the joining force can be from about 10,000 p.s.i. or less to about 18,000 p.s.i. or more, and preferably from about 15,000 to about 17,000 p.s.i. Other joining forces are possible.

Partially deforming of the projections occurs when a heat produced by a friction created from contacting the projection and groove surfaces causes the projections to deform or soften at the point of contact and to substantially take the shape of the groove and thereby interlock, connect, or otherwise bond the target member and the backing member when the projection hardens. The friction produced by contacting the projection with the groove in the manner described above, heats the surface of a projection and the surface of the groove to an elevated temperature in the region where the friction occurs. The local heating causes the low melting point material to soften and partially deform. Deformation of the projection occurs in the area that is in contact with the groove. Preferably, deforming of the projection occurs at the distal end of the projection. The softened material of the projection flows into the recesses of the groove. As the projection is deformed, the overall length of the projection is preferably shortened and the backing member and the target member move closer together as long as pressure is applied in the direction of the interface. When the desired amount of projection deforming is achieved, the relative lateral motion between the target member and the bonding member can be halted. When allowed to cool, the deformed portion of the projection hardens within the groove, thereby creating a tight physical connection and in some cases an optional metallurgical bond between the target member and the backing member.

The preferred method of slidably contacting the projections with the grooves as described above, is to use a friction welding machine to provide the rotation of the target member or the backing member and to provide the joining force. Any type of friction welding machine may be used, including, for example, that described in U.S. Pat. No. 5,342,496 (Stellrecht), incorporated in its entirety by reference herein. A cover gas can be used for sputtering target applications to protect the metals from oxidation during the joining process and to fill any voids with argon to protect the target user from contamination. Preferably, the cover gas is an inert gas, and, more preferably, argon. Additionally, a dopant gas can be added to the cover gas to dope the heated regions with an interstitial hardening agent or other agents.

Figure 3:
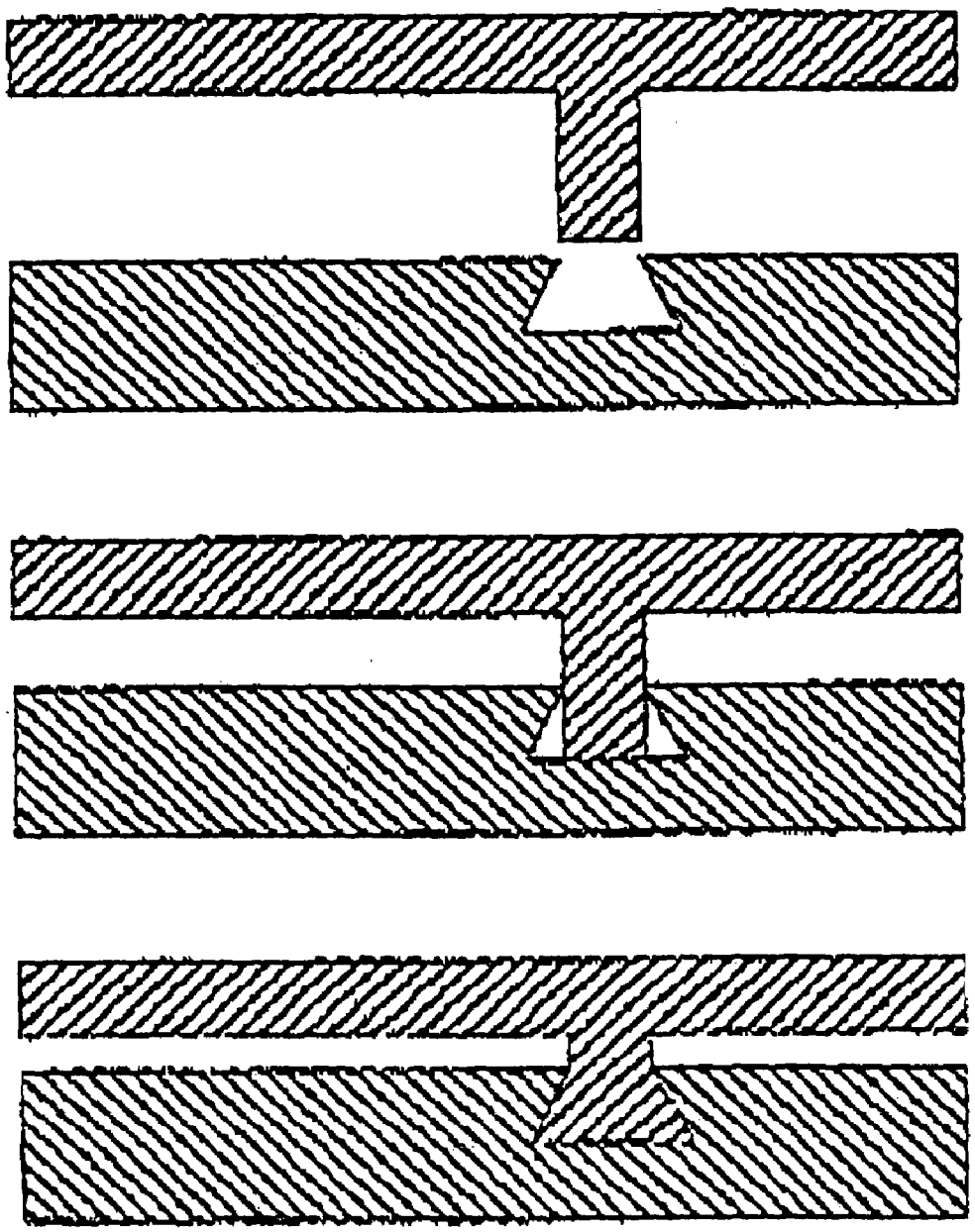
FIG. 3 is a sputtering target assembly of the present invention showing a gap formed between the assembled target and backing plate.

The shape and dimensions of the projections can be varied for various reasons. For example, it may be desired to have some projections to make initial contact with the grooves while other projections contact the surface of the grooves when the distance between the bonding surfaces has been reduced. Another example according to an optional embodiment of the present invention is that a gap can be formed between a portion of the bonding surface of the target member and a portion of the bonding surface of the backing member after having formed a locking bond, with the projections disposed intermittently in the gap. One method for forming such a gap, for example, is to have the volume of the projection greater than the volume of the groove such that the groove is substantially filled by the deformed distal end of the projection and a portion of the proximal end remains outside the opening of the groove. FIG. 3 shows an example of this optional embodiment of the present invention. The gap can be any width, such as from about 0.001 inch or less to 0.25 inch or more. The width of the gap can vary at any point between the bonded members. In certain embodiments, it is desirable to control the heat transfer or exchange between the target and the backing plate during the sputtering process. Forming a gap between the target and the backing plate reduces the heat transfer between the two, such that the temperature of the target is increased during the sputtering process. Increasing the temperature of the target can have the desired effects of stabilizing conditions for reactive sputtering; increasing the substrate temperature by radiative heating; and broadening the emission trajectories of the sputtered atoms, and thereby promoting uniformity of thickness of the deposited film.

In an optional embodiment of the present invention, a braze alloy or braze metal can be located on any of the contacting surfaces including surfaces on the projections and/or surfaces on the groove. Similarly, a solder alloy or solder metal can be located on any surface of the projection or the groove. The solder can be a solid or liquid. Preferably, the braze or solder alloy (or metal) has a melting point of at least 400° C. The braze or solder alloy or metal is melted by the friction heat generated from the contact between the projection surfaces and the groove surfaces in the manner described above. The presence of the braze or solder metal or alloy strengthens or permits the bond between the contact surfaces. Examples of brazing material include, but are not limited to silver, niobium, tin, indium, zinc, lead, antimony, bismuth, aluminum, gold, cadmium, gallium, copper, nickel, vanadium, titanium, or zirconium, or alloys thereof (e.g., Sn—Pb or Sn—Ag solders). The brazing material can be applied by method and is preferably a liquid. The brazing material can be used with or without flux. Friction brazing preferably requires less energy to form the desired bond than friction welding. For example, friction brazing preferably requires from about 1 to about 90% less energy to form a similar bond by friction welding.

Figure 4:
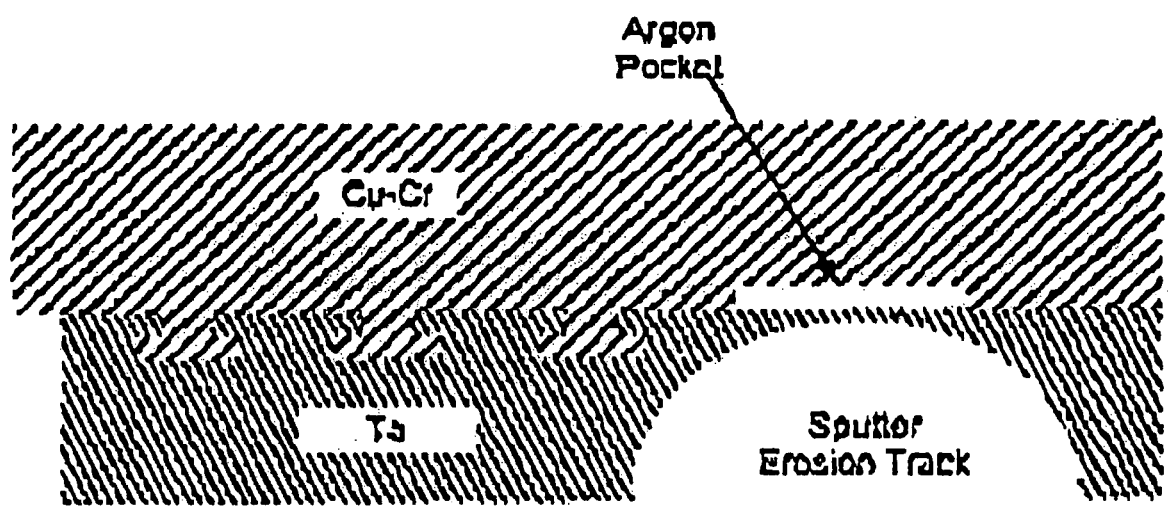
FIG. 4 is a cutaway view of a sputtering target assembly of the present invention that includes a gas cell formed at the interface of the bonding surfaces of the target and the backing plate.

In an optional embodiment of the present invention, at least one cell member having a plurality of sides or walls is formed near the interface between the bonding surfaces of the target member and the backing member. Preferably, the cell member is located in an area of greatest sputtering erosion. More than one cell member can be formed. The cell member can be filled with gas. The gas in the cell member can be an inert gas, preferably argon. The cell member can be of any shape, for example, rectangular or spherical. The shape of the cell member can be regular or irregular. Multiple cell members can have dissimilar shapes. The pressure of the gas in the cell member can be from about 0.1 to 10 atmospheres or higher, and is preferably about 1 atmosphere. The cell member can be of any volume, such as from about 0.1 cubic inch to 10 cubic inches. The cross-sectional dimensions of the cell can be from about 0.01 inch×0.1 inch to about 0.25 inch×2 inches, and more preferably from about 0.05 inch×0.5 inch to about 0.1 inch×1 inch. Preferably, at least one side of the cell member is a portion of the bonding surface of the target member. FIG. 4 shows an example of the embodiment. One or more walls of the cell member can be defined by a portion of the target member. One or more walls of the cell member can be defined by a portion of the backing member. The cell member can be formed entirely in the backing member. The cell member can be formed entirely in the target member. The cell member can be formed generally in the projection-containing member in an area between two projections. The cell member can be formed generally in the groove-containing member in an area between two grooves. The cell member can be formed by forming a pocket in the projection-containing member, the groove-containing member, or both. The cell member can be formed by joining the target member to the backing member. A gas can be introduced in the cell member at the time that the cell member is formed. A gas can be introduced in the cell member by joining the target member and the backing member under a gas. In an embodiment of the present invention wherein a gap is formed between the bonding sides of the target member and the backing member, the cell member is preferably formed entirely in the target member in an area proximate a deepest portion of the groove.

The cell member is a mechanism for preventing the target user from sputtering into the backing plate. The cell member bursts when the layer of target adjacent the cell member is eroded to a predetermined thickness. When the cell member bursts, a transient pressure occurs in a sputtering chamber in which the sputtering process takes place and pressure monitor(s) signals to the user to stop the sputtering process. An example of a pressure monitor for this purpose is a capacitance manometer or Pirani gauge.

The previously described versions of the present invention have many advantages, including sound bonds achieved at low temperatures and with less energy. The bonds or joints of the projections and grooves can form a substantially hermetic seal, characterized by leak rates as low as about $1 \times 10^{-8}$ cm$^3$/sec or lower (e.g., $1 \times 10^{-5}$ to $1 \times 10^{-8}$ cm$^3$/sec).

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A method of forming a sputtering target assembly comprising a backing member and a target member, comprising:

positioning a member having a bonding side with a plurality of projections, and a member having a bonding side with a plurality of grooves adapted to receive said projections, whereby said projections and said grooves are in substantial registration, and wherein an interface is defined by said bonding surfaces;

slidably contacting a portion of at least one projection with a portion of at least one groove effective to generate frictional heat that softens and deforms the at least one projection; and partially deforming said at least one projection effective to at least partially fill said at least one groove, which said at least one deformed projection upon cooling and hardening thereby forming at least a mechanical bond between the target member and the backing member, wherein said member having said grooves is a metal having a melting point higher than that of the metal which comprises the projections.

2. The method of claim 1, wherein said member having said projections is said target member and said member having said grooves is said backing member.

3. The method of claim 1, wherein said member having said projections is said backing member and said member having said grooves is said target member.

4. The method of claim 1, wherein said member having said grooves comprises cobalt, titanium, copper, aluminum, tantalum, niobium, nickel, molybdenum, zirconium, hafnium, gold, silver or alloys thereof.

5. The method of claim 1, wherein said member having said grooves comprises tantalum or alloys thereof.

6. The method of claim 1, wherein said member having said grooves comprises niobium or alloys thereof.

7. The method of claim 1, wherein said member having said projections comprises cobalt, titanium, copper, aluminum, tantalum, niobium, or alloys thereof.

8. The method of claim 1, wherein said member having said projections comprises a copper-chromium or copper-zinc alloy.

9. The method of claim 1, wherein said projections are of irregular shape.

10. The method of claim 1, wherein said projections are substantially cylinders, cones, truncated cones, cubes, cuboids, pyramids, obelisks, or wedges, or combinations thereof.

11. The method of claim 1, wherein said grooves are substantially in the shape of a square, rectangle, "T", "L", semicircle, truncated triangle, cusp, or a bowtie.

12. The method of claim 1, wherein said bond is formed such that a portion of the bonding side of said target member contacts at least a portion of the bonding side of said backing member.

13. The method of claim 1, wherein said bond is formed such that a gap is formed between at least a portion of the bonding side of the target member and a portion of the bonding side of said backing member.

14. The method of claim 1, wherein at least one groove has a shape that is different from a shape of at least one other groove.

15. The method of claim 1, wherein at least one projection has a shape that is different from a shape of at least one other projection.

16. The method of claim 1, wherein at least one groove has a volume that is different from a volume of at least one other groove.

17. The method of claim 1, wherein at least one projection has a volume that is different from a volume of at least one other projection.

18. The method of claim 1, wherein slidably contacting comprises rotating said member having said projections relative to said member having said grooves or vice versa, and applying a force to said member having said projections, said member having said grooves, or both members, in a direction of said interface.

19. The method of claim 18, wherein said rotating is at a rotational speed of from about 500 to about 2000 surface-ft/mm.

20. The method of claim 18, wherein said force is a joining force of from about 10,000 to about 18,000 p.s.i.

21. The method of claim 18, wherein said mechanical bond is achieved by a rotational energy of from about 60 to about 190 ft-lb/in$^2$.

22. The method of claim 18, wherein said rotating is at a rotational speed of from about 500 to about 2000 rpm.

23. The method of claim 1, wherein slidably contacting comprises rotating said members relative to each other and applying a force to said member having said grooves, said member having said projections, or both members, in a direction of said interface.

24. The method of claim 23, wherein said rotating is at a rotational speed of from about 500 to about 2000 surface-ft/mm.

25. The method of claim 23, wherein said force is a joining force of from about 10,000 to about 18,000 p.s.i.

26. The method of claim 23, wherein said mechanical bond is achieved by a rotational energy of from about 60 to about 190 ft-lb/in$^2$.

27. The method of claim 23, wherein said rotating is at a rotational speed of from about 500 to about 2000 rpm.

28. The method of claim 1, wherein a friction welding machine is used to slidably contact said portions.

29. The method of claim 1, wherein said bond comprises an interlocking bond and/or mechanical joint.

30. The method of claim 1, further comprising disposing a solder metal or solder alloy or braze metal or braze alloy, or combination thereof on at least a portion of said at least one projection.

31. The method of claim 1, further comprising disposing a solder metal or solder alloy or braze metal or braze alloy, or combination thereof on at least a portion of the bonding side of said member having said projections.

32. The method of claim 1, further comprising disposing a solder metal or solder alloy or braze metal or braze alloy, or combination thereof on at least a portion of said at least one groove.

33. The method of claim 1, further comprising disposing a solder metal or solder alloy or braze metal or braze alloy, or combination thereof on at least a portion of the bonding side of said member having said grooves.

34. The method of claim 1, further comprising forming a cell member having a plurality of sides, wherein said cell member is formed proximate to said interface.

35. The method of claim 34, wherein at least one of said sides comprises a portion of the bonding side of said member having said grooves.

36. The method of claim 34, further comprising disposing a gas in said cell member.

37. The method of claim 36, wherein said gas comprises argon.

38. The method of claim 36, wherein a pressure of said gas in said cell member is about 1 atmosphere.

39. The method of claim 1, wherein forming said sputtering target assembly is under a cover gas.

40. The method of claim 39, wherein said cover gas comprises an inert gas.

41. The method of claim 40, wherein said inert gas comprises argon.

42. The method of claim 39, wherein said cover gas is doped with interstitial hardening agents such as oxygen or nitrogen.

* * * * *